United States Patent
Hellberg et al.

(10) Patent No.: US 6,817,527 B2
(45) Date of Patent: Nov. 16, 2004

(54) CARRIERS FOR PRINTED CIRCUIT BOARD MARKING

(75) Inventors: Petri Hellberg, Salo (FI); Jukka Tiilikainen, Helsinki (FI); Juha Penttinen, Salo (FI)

(73) Assignee: Nokia Corporation, Espoo (FI)

( * ) Notice: Subject to any disclaimer, the term of this patent is extended or adjusted under 35 U.S.C. 154(b) by 113 days.

(21) Appl. No.: 10/187,471

(22) Filed: Jun. 28, 2002

(65) Prior Publication Data

US 2004/0000584 A1 Jan. 1, 2004

(51) Int. Cl.[7] ................................. G06K 7/10
(52) U.S. Cl. ............. 235/462.01; 235/375; 235/462.13
(58) Field of Search ................ 235/376, 462.01, 235/462.13, 487, 494, 375, 470, 385, 462.08, 900; 29/832, 701; 700/56; 438/14

(56) References Cited

U.S. PATENT DOCUMENTS

| | | | |
|---|---|---|---|
| 5,118,369 A | * | 6/1992 | Shamir .................. 235/462.01 |
| 5,321,885 A | * | 6/1994 | Hino et al. ................... 29/832 |
| 5,329,690 A | * | 7/1994 | Tsuji et al. ................... 29/701 |
| 5,484,999 A | | 1/1996 | Priddy et al. ................ 235/494 |
| 5,923,022 A | * | 7/1999 | Penn et al. ............. 235/462.08 |
| 6,218,199 B1 | * | 4/2001 | Sato ............................. 438/14 |
| 6,352,204 B2 | * | 3/2002 | Hattersley et al. ...... 235/472.01 |
| 6,480,751 B1 | * | 11/2002 | Kuribayashi et al. ......... 700/56 |
| 2002/0036235 A1 | * | 3/2002 | Kudo ..................... 235/462.01 |
| 2003/0102367 A1 | * | 6/2003 | Monette et al. ............. 235/376 |
| 2004/0094630 A1 | * | 5/2004 | Tani ........................... 235/487 |
| 2004/0134979 A1 | * | 7/2004 | Kudo ......................... 235/376 |

FOREIGN PATENT DOCUMENTS

| | | | |
|---|---|---|---|
| GB | 2 251 105 A | * | 6/1992 |
| JP | 6328275 | | 11/1994 |
| JP | 10-326950 A | * | 12/1998 |

* cited by examiner

Primary Examiner—Jared J. Fureman

(57) ABSTRACT

The invention relates to preparations, a component tape and a component tape reel for marking printed circuit boards with respective unique identification codes. Carriers with respective unique identification codes printed thereon are packaged and provided in such way that the carriers can be mounted on respective circuit boards by an automated component mounting process. Thus, the invention enables a surface mount placement system to pick the carriers for placement on respective circuit boards, thereby marking the circuit boards with respective unique identification codes in a fully automated manner.

14 Claims, 1 Drawing Sheet

CARRIERS FOR PRINTED CIRCUIT BOARD MARKING

TECHNICAL FIELD OF THE INVENTION

The invention relates to preparations, a component tape and a component tape reel for marking printed circuit boards with respective unique identification codes.

BACKGROUND OF THE INVENTION

During manufacturing of printed circuit boards it is most often desired to be able to track and trace the manufactured circuit boards. For this reason, each manufactured circuit board may be provided with an identification code unique to the circuit board. Such is marking of circuit boards with unique identification codes can, for example, be made by ordinary stickers. In case optical readability of the code is desired, the sticker may include the code in the form of a bar code or some other readable code. In the prior art, circuit boards are often marked with identification codes by having the code laser marked or edged on the circuit board.

An example of an identification code that suitably can be used for marking circuit boards is disclosed by Priddy et al. in U.S. Pat. No. 5 484 999. This document described a machine readable, two-dimensional matrix representing a binary code. One such code is formed as a "checker board" symbol that represents information in the form of light and dark squares. This code is variable in size, format and density of information. The code allows a scanning computer to recognize, understand and act upon the encoded information regardless of the actual physical size or volume of data contained within the symbol representing the code.

JP, 06328275, discloses a method for improving the durability of codes marked on steel articles by oxidation or laser.

In all of the above described schemes for marking a circuit board, there is the problem of design space limit on the circuit board, i.e. the problem of finding a suitable, and big enough, space for the marking on the board. Another problem is that determination of such a space is separated from the board design process during which the board space utilization is optimized using a computer executed optimization program specifically designed for such a task. Thus, the existing solutions for marking circuit boards will require a certain amount of non-automated interaction with the circuit board manufacturing process, or possibly even with each single manufactured circuit board.

Another problem is that each circuit board manufacturer needs to adopt and implement its own process to be used for marking its manufactured circuit boards.

SUMMARY OF THE INVENTION

An object of the invention is to enable a more efficient, and a more cost effective, marking of printed circuit boards or of products including printed circuit boards.

Another object is to overcome at least one of the problems mentioned above with respect to marking of printed circuit boards.

According to a first aspect of the present invention, a method of making preparations for marking printed circuit boards with respect to unique identification codes includes the steps of printing unique identification codes on respective carriers, and packaging the carriers in such a way that the carriers are retrievable by an automated component mounting process for mounting the carriers on respective printed circuit boards. The identification codes may be codes which are optically readable by a machine. The identification codes may be two-dimensional matrices representing binary codes which are optically readable by a machine. The printing step may include printing the unique identification codes by way of laser marking of the carriers. The printing step may include printing the unique identification codes by way of punching of the carriers. The packaging step may include packaging the carriers on a component tape for surface mounted device (SMD) components. The carriers may be metallic carriers. The carriers may be carriers with a lower metallic part and an upper plastic part, the printing step including printing on the plastic part of the carriers.

According to a second aspect of the present invention, a method of making preparations for marking printed circuit boards with respective unique identification codes, includes the steps of printing unique, optically-readable identification codes on respective carriers, and packaging the carriers on a surface-mounted device (SMD) component tape for subsequent retrieval and mounting on respective printed circuit boards.

According to a third aspect of the present invention, a surface-mounted device (SMD) component tape with carriers for mounting on respective printed circuit boards is provided wherein each carrier is marked with an identification code which is unique for that carrier. The identification code of the SMD component tape may be a code which is optically readable by a machine. The identification code of the SMD component tape may be a two-dimensional matrix representing a binary code which is optically readable by a machine. Each carrier may be laser-marked with an identification code which is unique for that carrier. Each carrier may be punch-marked with an identification code which is unique for that carrier. The carriers may be packaged on the component tape for SMD components. The carriers may be metallic carriers. The carriers may be carriers with a lower metallic part and an upper plastic part, wherein it is the plastic part of each carrier that is marked with an identification code which is unique for that carrier.

According to a fourth aspect of the present invention, a surface-mounted device (SMD) component reel having a component carrier tape includes a tape with carriers for mounting on respective printed circuit boards wherein each carrier is marked with an identification code which is unique for that carrier.

According to the invention, carriers with respective unique identification codes printed thereon are packaged and provided in such way that the carriers can be mounted on respective circuit boards by an automated component mounting process. Thus, the invention enables a surface mount placement system to pick the carriers for placement on respective circuit boards, thereby marking the circuit boards with respective unique identification codes in a fully automated manner.

By providing the carriers in a component tape, or in a component tape on a component reel, the invention makes it possible for a surface mount placement system to use a standard tape feeder when picking the carriers and placing them on the circuit boards.

As the carriers, or the pick and place pads, have respective unique identification codes printed thereon, the process of marking a printed circuit board, or a product which includes a printed circuit board, is greatly simplified and made much more cost effective. As is understood such unique marking is desired in order to be able to track the product or circuit board during its manufacturing, its intermediate storage before shipment, as well as after its shipment to a customer.

As the invention enables the surface mount placement system to mark circuit board in accordance with a pick and place process normally used for mounting components, the marking of the circuit boards can be made in accordance with the chosen circuit board design rules. This makes it possible to take design space limit problems into account also for the marking process. Thus, the invention will enable a circuit board manufacturer not only to save board space, but also to improve the planning of the board space, both of these issues often being of great importance for a circuit board manufacturer in order to achieve efficiency and cost effectiveness when producing circuit boards.

Another advantage with the invention is that it eliminates the need for every circuit board manufacturer to implement its own process of marking the circuit boards. Instead, with the present invention the carrier carrying the circuit board identification codes may be produced at a single location and then shipped, in component tapes, to different circuit board manufacturers at different locations.

Advantageously, to enable an efficient way of tracking and tracing the marked circuit board, each identification code printed on a carrier represents an optically readable binary code. According to an embodiment of the invention, the identification code may be a two-dimensional matrix representing a binary code in accordance with that disclosed in the prior art.

The printing of the identification codes on the carriers can be performed in a variety of different ways. It may be printed on the carrier using any of the techniques presently used for directly marking the surface of a circuit board, i.e. by laser marking, edging, oxidation or punching.

The carriers may be metallic carriers or carriers with a lower metallic part that has a softer upper part provided thereon. Such softer part may be made of a plastic layer, but also other soft materials suitable for the printing method chosen may be used for this upper part. The advantage of providing the carrier with a soft, e.g. plastic, upper part is that the printing of the carrier can be made faster if the printing is performed on a soft part rather than on metal.

BRIEF DESCRIPTION OF THE DRAWINGS

An exemplifying embodiment of the present invention will now be described with reference to the accompanying drawings, in which.

DETAILED DESCRIPTION OF THE INVENTION

Figure 1:
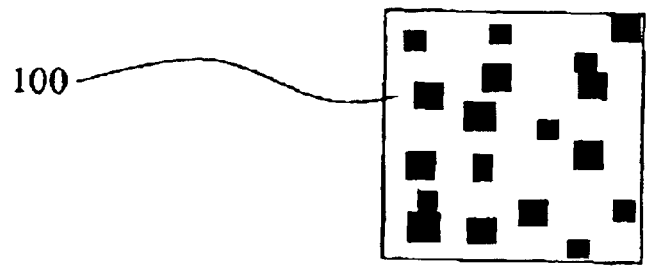
FIG. 1 shows a two-dimensional matrix representing a binary code in accordance with prior art.

In FIG. 1 a two-dimensional matrix representing a binary code is shown. Such matrices are known in the art. For instance, the above-mentioned U.S. Pat. No. 5,484,999 shows a checker board symbol comprising data in a plurality of data elements arranged in a two dimensional array that represents information in the form of light and dark squares or data elements. The binary code can be scanned by a computer in order for the computer to recognize, understand and act upon the encoded information of the symbol representing the code.

Figure 2:
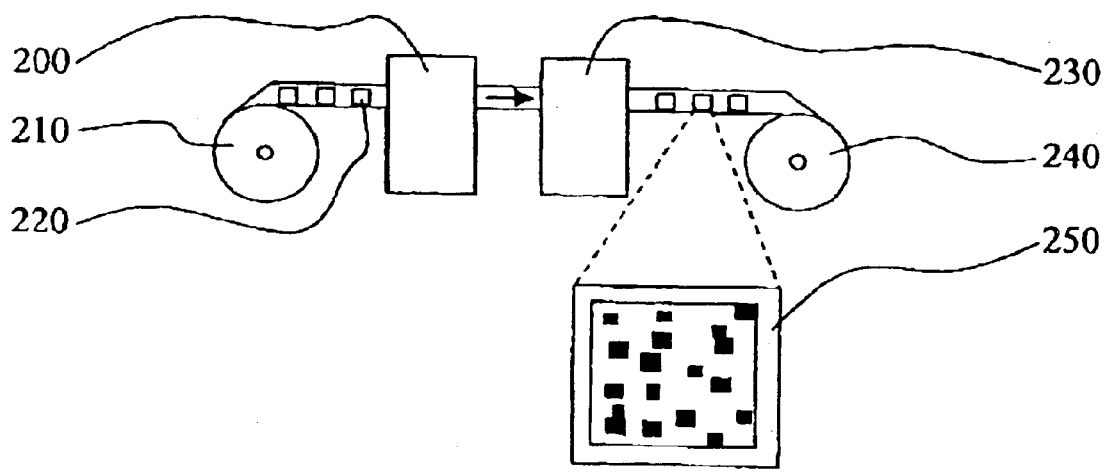
FIG. 2 schematically shows an exemplifying system which includes the elements and illustrates the method of an embodiment of the invention in Step 1 and Step 2.
Figure 2:
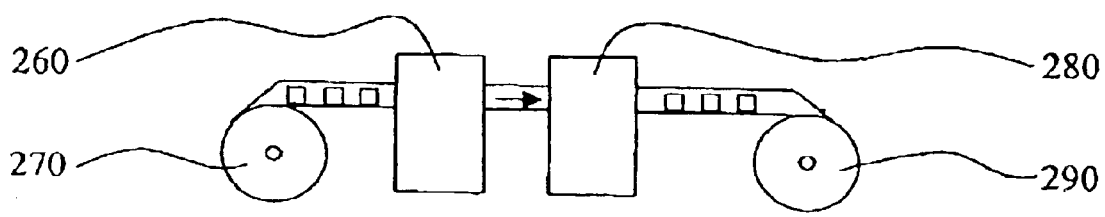

With reference to FIG. 2 a system is shown which illustrates the elements and the method in accordance with an exemplifying embodiment of the present invention.

In FIG. 2 the system and its operation is depicted as a two-step process. In step 1 a laser marking machine 200 is fed with a strip of carriers 220 from a strip reel 210. The strip of carriers is then fed to a second machine 230 for punching of the carriers in accordance with the laser markings. Thus, in this embodiment the printing of unique identification codes is accomplished by laser marking followed by punching of the carriers. The laser marking and punching is performed in accordance with any state of the art techniques. It should be understood that various other techniques may be used for printing the unique identification codes on the carriers. Examples of such techniques are laser marking only by engraving the codes with a laser beam, or marking the carriers by means of oxidation. Yet alternative methods of printing, or marking, of the codes on the carriers will be appreciated by a person skilled in the art.

The carriers may be metallic carriers or carriers with a lower metallic part on which an upper softer, plastic part has been provided. Of course, the choice of carrier and any upper part material may also be dependent on the method used for printing the carriers, since printing will occur on the upper part of the carrier, whether this is metallic or plastic.

The unique identification codes printed on the carriers may be any type of codes that are suitable for future identification control by optical reading of the codes. At present, known binary code represented by a two-dimensional matrix, as disclosed by Priddy et al. in U.S. Pat. No. 5,484,999 and also described with reference to FIG. 1, are considered to be suitable for implementing such unique identification codes.

After printing the carriers in step 1 of the process described in FIG. 2, i.e. after laser marking by machine 200 and punching by machine 230, each carrier will have an identification code printed on it as illustrated by reference numeral 250. In the embodiment of FIG. 2, reference numeral 250 indicates that the identification codes in this case have been implemented by the above mentioned two-dimensional matrix which represents a binary code. The strip with printed carriers are wound up on a reel 240, a process which is kept in pace with the printing of the carriers occurring later on the strip. Finally, when all carriers of the strip have been printed and wound up on reel 240, this reel 240 is used to feed step 2 of the process illustrated by FIG. 2.

The reel with printed carriers from step 1 is in step 2 indicated with reference numeral 270. Step 2 concerns the process of packaging the carriers in such way so as to make them suitable for use by a future automated component mounting process.

The strip with carriers with printed identification codes thereon is fed from the reel 270 to a machine 260. The machine 260 is arranged to cut carrier pins on the carriers, preferably from the lower part of the carriers, in accordance with state of the art techniques and in order to make the carriers suitable for printed circuit board mounting. The with pins arranged carriers are then fed to a machine 280, which machine transfers the carriers to a component tape of the kind used by the intended future automated component mounting process. As is understood by a person skilled in the art, different mounting processes may use different kinds of component tapes. It should be appreciated that these component tapes generally may be referred to as SMD (Surface Mounted Device) component tapes. At the end of step 2 of the process the SMD component tape is wound up on a reel 290.

Thus, after step 2 of the process illustrated by FIG. 2, an SMD component tape is provided which includes carriers suitably arranged and packaged for mounting on respective printed circuit boards by an automated component mounting process. This component tape may be provided separated from, or together with, the reel on which it was wound up during the described process.

It should be appreciated that even though the process in FIG. 2 has been divided in two steps, the process may alternatively be performed as one single step encompassing all the operations described above with reference to step 1 and step 2.

It should be noted that the detailed description above of an embodiment of the invention is given by way of illustration only, and that various alterations and modifications within the spirit and scope of the invention will become apparent to those skilled in the art.

What is claimed is:

1. A surface mounted device (SMD) component reel with a component carrier tape, which tape includes carriers for mounting on respective printed circuit boards, wherein each carrier is marked with an identification code which is unique for that carrier, wherein the carriers for mounting on respective printed circuit boards are for processing by a machine (260) to cut carrier pins on the carriers to make the carriers suitable for printed circuit board mounting and are for feeding to a machine (280) for transferring the carriers with pins to a component tape for use in an automated component mounting process.

2. A method of making preparations for marking printed circuit boards with respective unique identification codes, including the steps of: printing unique identification codes on respective carriers, packaging the carriers in such way that the carriers are retrievable by an automated component mounting process for mounting the carriers on respective printed circuit boards, feeding said carriers on a strip from a strip reel (210) to a printing machine (200), a punching machine (230), or both, and winding up said carriers on said strip onto a reel (240) with printed carriers thereon, and providing said printed carriers from said reel (240, 270) to a machine (260) for providing carriers with pins suitable for said packaging.

3. The method as claimed in claim 2, wherein the identification codes are codes which are optically readable by a machine.

4. The method as claimed in claim 2, wherein the identification codes are two-dimensional matrices representing binary codes which are optically readable by a machine.

5. The method as claimed in claim 2, wherein said printing step includes printing the unique identification codes by way of laser marking of the carriers.

6. The method as claimed in claim 2, wherein said printing step includes printing the unique identification codes by way of punching of the carriers.

7. The method as claimed in claim 2, wherein said packaging step includes packaging the carriers on a component tape for surface mounted device (SMD) components.

8. The method as claimed in claim 2, wherein said carriers are metallic carriers.

9. The method as claimed in claim 2, wherein said carriers are carriers with a lower metallic part and an upper plastic part, the printing step including printing on the plastic part the carriers.

10. The method of claim 2, wherein said codes each comprises data in a checkerboard symbol (250) that represents information in the form of light and dark data elements.

11. A method of making preparations for marking printed circuit boards with respective unique identification codes, including the steps of, printing unique optically readable identification codes on respective carriers, packaging the carriers on a surface mounted device (SMD) component tape for subsequent retrieval and mounting on respective printed circuit boards, feeding said carriers on a strip from a strip reel (210) to a printing machine (200), a punching machine (230), or both, and winding up said carriers on said strip onto a reel (240) with printed carriers thereon, and providing said printed carriers from said reel (240, 270) to a machine (260) for providing carriers with pins suitable for said packaging.

12. The method of claim 11, wherein said codes each comprises data in a checkerboard symbol (250) that represents information in the form of light and dark data elements.

13. A method of making preparations for marking printed circuit boards with respective unique identification codes, including the steps of: printing unique, optically readable identification codes on respective carriers on a reel (260) for processing by a machine (260) to cut carrier pins on the carrier to make the carriers suitable for printed circuit board mounting; and packaging the carriers on a surface mounted device (SMD) component tape for subsequent retrieval and mounting on respective printed circuit boards.

14. A component reel (240, 270) with a component carrier tape, which tape includes carriers for processing by a machine (260) to cut carrier pins on the carriers to make the carriers suitable for printed circuit board mounting, wherein each carrier is marked with a two-dimensional matrix identification code which is unique for that carrier.

* * * * *